United States Patent [19]

Grasser et al.

[11] Patent Number: 4,835,006
[45] Date of Patent: May 30, 1989

[54] PROCESS FOR THE PASSIVATION OF CRYSTAL DEFECTS

[75] Inventors: Heinrich Grasser; Adolf Muenzer, both of Munich, Fed. Rep. of Germany

[73] Assignee: Siemens Aktiengesellschaft, Berlin and Munich, Fed. Rep. of Germany

[21] Appl. No.: 107,442

[22] Filed: Oct. 13, 1987

[30] Foreign Application Priority Data

Oct. 24, 1986 [DE] Fed. Rep. of Germany ....... 3636340

[51] Int. Cl.$^4$ .............................................. B05D 3/06
[52] U.S. Cl. ........................................ 427/39; 427/58
[58] Field of Search ................................. 427/39, 58

[56]  References Cited

U.S. PATENT DOCUMENTS 4,152,478  5/1979  Takagi ................................ 428/221
4,343,830  8/1982  Sarma et al. ......................... 427/38

OTHER PUBLICATIONS

Applied Phys. Ltr., vol. 47, No. 2, 7/85, Cannavo et al., pp. 138–140.
Journal of Applied Phys., vol. 57, No. 12, 5/85, Hwang et al., pp. 5275–5278.
Japanese Journal of Applied Phys., vol. 22, No. 1, 1/83, Matsuda et al., pp. L34–L36.
Patent Abstracts of Japan, vol. 6, No. 189, 9/28/82, No. 57-102027.
IEEE Journal, vol. EDL-6, No. 3, 3/85, Singh et al., pp. 139–141.
Applied Phys. Ltr., vol. 35, No. 7, 10/79, Makino et al., pp. 551–552.
Applied Phys. Ltr., vol. 41, No. 11, 12/82, Lagowski et al., pp. 1078–1080.

Primary Examiner—Bernard Pianalto
Attorney, Agent, or Firm—John F. Moran

[57] ABSTRACT

A process for the passivation of crystal defects or grain boundaries or internal grain defects or surfaces in an electrically conductive material in a plasma, where the passivation is carried out by the influence of suitable ions on the electrically conductive material to facilitate a shorter process time and lower stress on the electrically conductive material. A high-frequency gas discharge plasma is acted upon by a superimposed d.c. voltage which serves to accelerate the ions, suitable to carry out the passivation, towards the electrically conductive material.

32 Claims, 5 Drawing Sheets

FIG 2
FIG 3
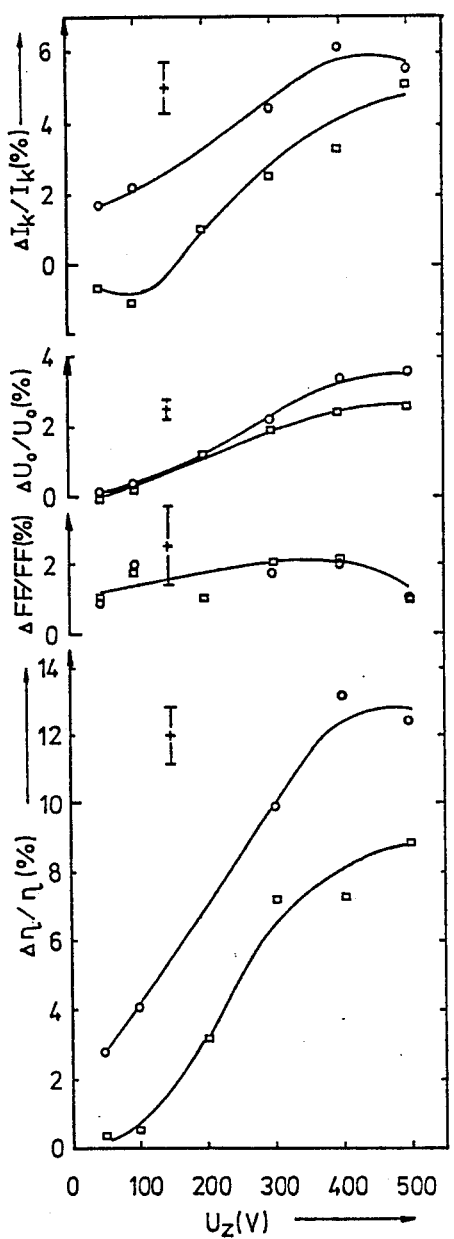
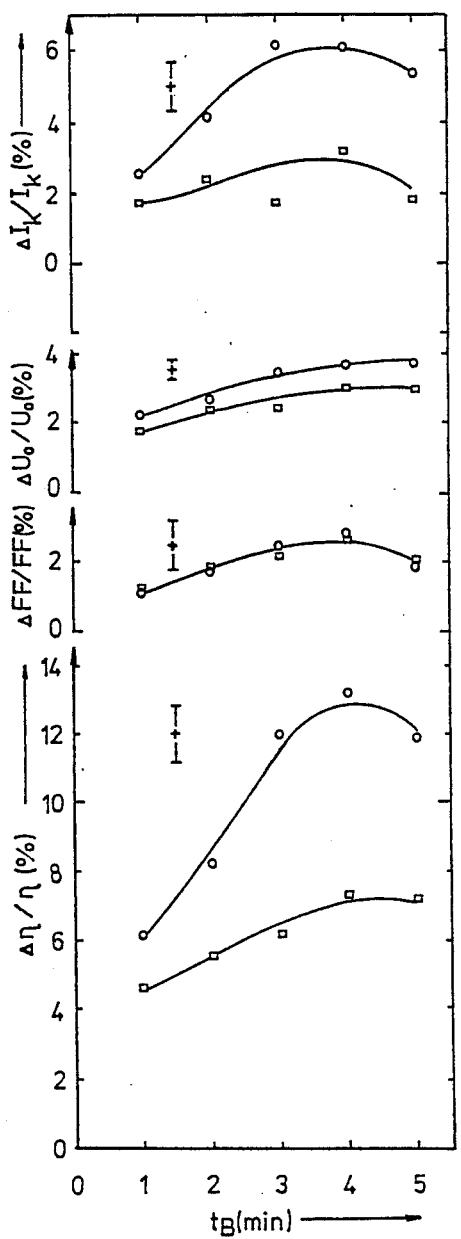

PROCESS FOR THE PASSIVATION OF CRYSTAL DEFECTS

BACKGROUND OF THE INVENTION

This invention relates to a process for the passivation of crystal defects or grain boundaries or internal grain defects or surfaces in an electrically conductive material, and it relates, more particularly, to a process wherein the passivation is achieved by influencing suitable ions on the electrically conductive material.

In polycrystalline silicon, in contrast to monocrystalline silicon, due to the result of the occurrence of recombination effects at grain boundaries and internal grain defects, reductions in quality are likely in the solar cells produced from polycrystalline silicon. In recent years various processes have been proposed whereby such recombination effects is reduced or eliminated. Most of these processes are based on exposing the silicon wafers to an atmosphere containing hydrogen. In this hydrogen treatment of the silicon wafers, $Si—H_x$-bonds can occur which passivate the "dangling bonds" at grain boundaries and at internal grain defects. The effective diffusion length of the charge carriers is thus increased and the life duration of the minority charge carriers is improved. This means that the light output of a solar cell produced from a silicon wafer of this type is increased.

Conventional hydrogen passivation processes are based on:

(a) hydrogen ion bombardment from a Kaufmann-ion source onto a cold or heated substrate,
(b) the action of a high-frequency-hydrogen-gas discharge plasma on a cold or heated substrate,
(c) the action of a DC-hydrogen-gas discharge-plasma on a cold or heated substrate,
(d) treatment of a substrate in a molecular hydrogen atmosphere at temperatures of around 600° C.

SUMMARY OF INVENTION

An object of the present invention is to provide a further improvement over a process of the type wherein crystallographic structure defects occur at internal grain boundaries or surfaces in electrically conductive material.

In accordance with the invention, a HF-hydrogen-gas discharge plasma is acted upon by a superimposed d.c. voltage which serves to accelerate the hydrogen ions in the direction of a substrate. The process in accordance with the invention combines the advantages of treating a substrate in pure plasma (ion concentration) with the advantages of ion implantation (high ion energy). The substrate or plurality of substrates is/are advantageously arranged on an electrode in the process chamber which serves to delimit the plasma.

The fundamental advantages of a process in accordance with the invention involves the possibility of a large-area and geometrically independent substrate treatment, in the possibility of high ion current density and in the possibility of short process times. The ion energy levels used may be adjusted by means of the connected d.c. voltage. In a process in accordance with the invention, the substrates are automatically heated by the ion bombardment so that it is advantageously possible to dispense with additional heating.

It was established in experiments that in a process in accordance with the invention, hydrogen passivation of grain boundaries and inner grain defects are achieved both in monocrystalline and polycrystalline solar cells.

A process in accordance with the invention may also be applied in other circumstances, for example, for the passivation of crystal defects in other materials.

Experimental investigations have shown that, for example, even after four minutes hydrogen treatment of a 100×100 mm SILSO solar cell of normal quality, a relative efficiency factor improvement of approx. 15% was achieved. In a solar cell module comprising 36 solar cells provided with a AR (anti-reflecting) coating, an output of approx. 41 watts was obtained following hydrogen treatment in accordance with the invention. The passivation achieved by a process in accordance with the invention is maintained even when a solar cell is subjected to thermal stress of 300° C. Temporary thermal stress of 400° does not lead to a reduction in the passivation achieved in accordance with the invention.

A hydrogen treatment in accordance with the invention allows an improvement to be achieved in the quality of dislocated monocrystalline materials, for example solar cells. Here relative efficiency factor improvements of up to 20% were obtained in experiments.

A process in accordance with the invention is based on a combination of plasma etching and ion implementation. The hydrogen ions produced in a hydrogen plasma are accelerated by the connection of a d.c. voltage an directed towards the material which is to be passivated. In comparison to other passivation processes the process time of a process in accordance with the invention is much shorter and therefore the thermal stress and other stress of the materials to be passivated is lower.

BRIEF DESCRIPTION OF THE DRAWING

The invention will now be explained in detail making reference to the drawing.

FIGS. 2 through 10 illustrate various improvements in material parameters in the application of a process in accordance with the invention.

DETAILED DESCRIPTION

Figure 1:
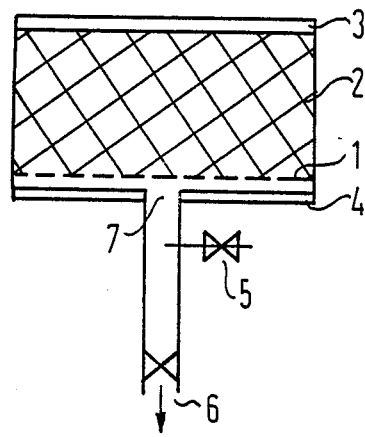
FIG. 1 is a diagram of a device for carrying out a process in accordance with the invention.

FIG. 1 is a diagram of a device for carrying out a process in accordance with the invention. The process in accordance with the invention operates either with an input-coupled high-frequency-$H_2$-plasma 2 or with a separately excited high-frequency-$H_2$-plasma 2 in which latter case the electromagnetic field which generates the plasma and the electric field which forms the tractive force which accelerates hydrogen ions towards a substrate 1 can be regulated separately from one another. As a result, it is possible to adjust ion energy and ion current independently of one another within certain limits, so as to achieve an optimum passivation and in dependence upon the structure of the device shown in FIG. 1.

The capacitively or inductively excited high-frequency hydrogen plasma is generated in a hydrogen gas, and the hydrogen ions are accelerated towards a target which bears the substrate 1 which are to be passivated. The substrates 1 can be arranged flat or upright on the target.

Anode 3 and cathode 4 serve to connect the d.c. voltage. The substrates 1 are arranged on the cathode 4 which delimits the plasma.

The device represented in FIG. 1 comprises, for example, a container composed of a glass recipient with a cylindrical casing, a cover and a base. In this container, the hydrogen plasma 2 is inductively excited by a high-frequency coil which is wound around the cylindrical casing. The d.c. voltage which is to be superimposed upon the plasma is connected between the cover, which is electrically insulated from the casing, and the cathode 4. The cathode 4 is connected via an electrical lead-through—not shown in FIG. 1 to a voltage source arranged outside of the container. An opening 7 leads through the cathode 4 into the interior of the container. Through this opening 7, $H_2$-gas is introduced into the interior of the container by means of an inlet 5. The interior of the container may be evacuated via the opening 7 by means of the pump 6.

FIGS. 2 to 10 demonstrate the influence of a hydrogen treatment in accordance with the invention on electrically conductive materials. The experiments were based on polycrystalline SILSO-silicon-wafers and monocrystalline SETEK-silicon-wafers. The SILSO-material has a specific resistance of 2...3 Ohm cm, whereas the SETEK-wafers had a specific resistance of 1.0 ... 1.5 Ohm cm. All the investigated silicon wafers, whose sizes were of $100\times100$ mm and $50\times50$ mm, were provided in a standard phosphorus diffusion process with a flat, small p-n junction. The silicon wafers were metallized by a silver Ag-screen printing process designed for a layer resistance of approx. 55 Ohm/square. Then the solar cells were exposed to a high-frequency hydrogen plasma.

The quality improvement in solar cells which can be achieved by means of a hydrogen treatment is fundamentally dependent upon the operating parameters of acceleration voltage $U_z$, treatment time $t_B$, wafer temperature and starting quality of the solar cells.

FIG. 2 illustrates the relative improvement in the solar cell parameters in dependence upon the acceleration voltage $U_z$ with a fixed treatment time $t_B$ of three minutes.

FIG. 3 represents the relative improvement in the solar cell parameters in dependence upon the treatment time $t_B$ with a fixed acceleration voltage $U_z$ of 400 V.

In FIGS. 2 and 3 measured values for normal starting material are characterized by circles, and measured values for good starting material are characterized by squares. Typical error bars for the individual pairs of measurement curves have in each case are marked by a cross.

The dependency upon the acceleration voltage $U_z$ is as follows: for such time as the acceleration voltage $U_z$ has values of between 50 V and 500V, where ion current densities of between 1.7 mA/cm$^2$ and 2 mA/cm$^2$ occur, the cell characteristic data improves with an increase in the acceleration voltage $U_z$. Saturation occurs at an acceleration voltage of approx. 400 V. A similar curve relates to the dependency upon the treatment time $t_B$. Saturation or a maximum occurs at a treatment time $t_B$ of approx. 4 minutes.

In FIGS. 2 to 7, the no-load voltage $U_o$, the short-circuit current $I_K$, the space factor FF and the efficiency factor Eta have been represented as solar cell characteristic data.

The course of the measurement curves represented in FIGS. 2 and 3 is probably a result of the temperature dependency of hydrogen diffusion processes. In the described experiments, with an acceleration voltage $U_z$ of 400 V and with a treatment time $t_B$ of 4 minutes, a maximum temperature of approx. 400° C. was measured on the rear of a silicon wafer. The maximum attainable effective diffusion length was 60 $\mu$m.

In case of long treatment times negative sputtering phenomena can be observed in the silicon and the metallization. In the case of higher acceleration voltages $U_z$ the plasma flashing on the metallization - and thus the danger of holes forming in the silicon wafer - increase. An acceleration voltage $U_z$ of 400 V and a treatment time $t_B$ of 4 minutes are established as optimum parameter values for the silicon wafers which were used.

Experiments have indicated that the improvement in quality of solar cells is not fundamentally influenced by the hydrogen gas pressure $P_H$ and the high-frequency voltage $U_{HF}$. The selection of the optimum $U_{HF}$- and $P_H$- values is therefore fundamentally governed by the stability of the plasma burning and the reproducibility of the process. A high-frequency voltage $U_{HF}$ of 2.5kV and a hydrogen gas pressure $P_H$ of $7.6\times1.-^{-4}$ T or have proved suitable values.

In the measurement curves shown in FIGS. 2 and 3, a definite distinction between normal starting material and good starting material (SILSO-crude material) can be detected except for the space factor FF. In addition to the increase in quality, the hydrogen treatment also serves to reduce the quality divergence. As a result it is possible to increase the yield for better quality classes, as can be seen from FIGS. 4 to 7.

In FIGS. 4 to 7 the distribution of solar cell characteristic data prior to the hydrogen treatment has been indicated by a dotted histogram and that following the hydrogen treatment has been represented by a vertically shaded histogram.

Figure 4:
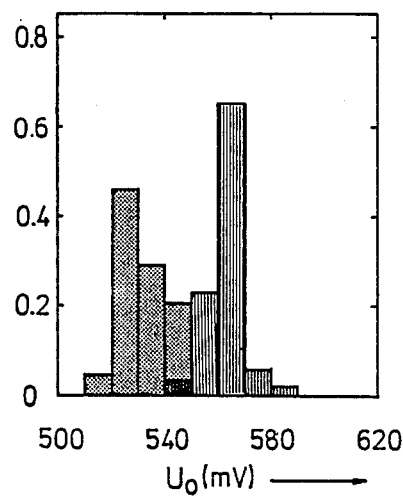

FIG. 4 represents the distribution of the no-load voltage $U_o$.

Figure 5:
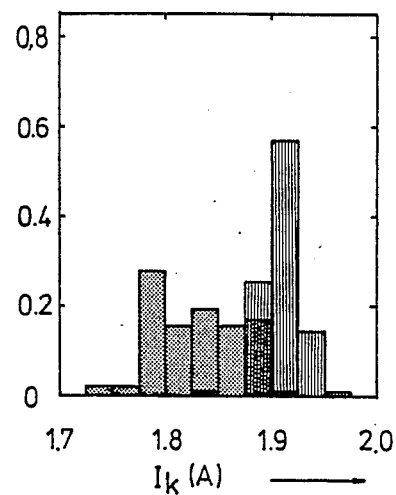

FIG. 5 represents the distribution for the short-circuit current $I_K$.

Figure 6:
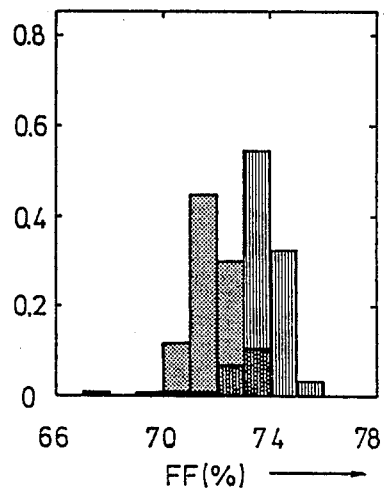

FIG. 6 represents the distribution for the space factor FF.

Figure 7:
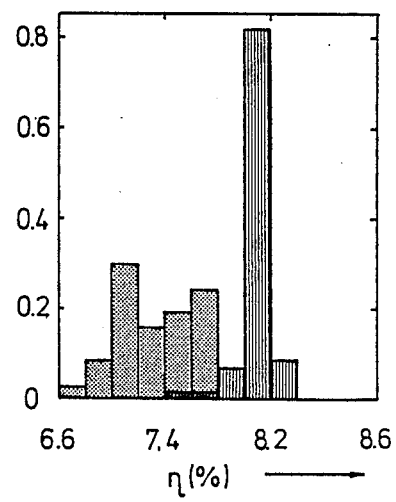

FIG. 7 illustrates the distribution for the efficiency factor Eta.

The diagrams in FIGS. 4 to 7 were each based on the same quantity of 83 solar cells. These solar cells were $100\times100$ mm SILSO solar cells which were not provided with a AR-coating.

Following hydrogen passivation in accordance with the invention solar cells composed of polycrystalline silicon have an output which is close to the output of comparable solar cells composed of monocrystalline silicon.

Hydrogen-passivated cells were exposed for 1 hour to a temperature of 300° C. without influencing the passivation. Under normal operating conditions in which a likely maximum temperature is 95° C., it can be assumed that no impairment of the passivation will occur.

Dislocated monocrystalline silicon-SETEK-solar cells were subjected to hydrogen treatment under standard conditions. These cells likewise exhibited a marked improvement in the solar cell parameters. The quality improvement arises solely from the passivation of dislocations. These disclosures were able to be rendered optically visible by SIRTL-etching.

The attenuation of the spectral sensitivity of a polycrystalline solar cell is fundamentally dependent upon the grain boundary recombination speed, the bulk diffusion length, and the grain size. However, these parameters only become manifest in the presence of long-wave light.

Figure 8:
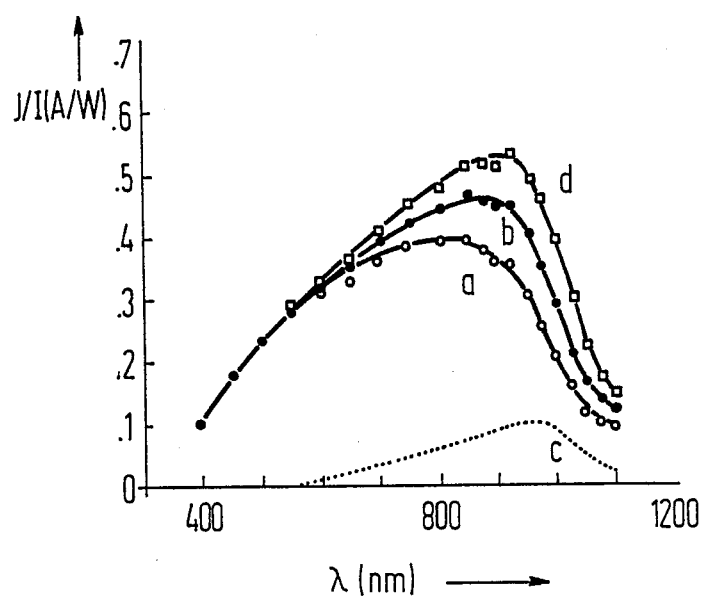

FIG. 8 represents the spectral sensitivity for 100×100 mm solar cells which have no AR-coating. Curve a represents a polycrystalline SILCO-solar cell prior to the hydrogen treatment. Here the effective diffusion length L is 39 um. Curve b represents the measurement carried out on a SILSO-solar cell following hydrogen treatment. Here the effective diffusion length amounts to 57 um. Curve c indicates the improvement as a result of the hydrogen treatment which is achieved on the transition from curve a to curve b. Curve d is typical of a comparable monocrystalline reference solar cell in which the diffusion length L has a value of 116 um.

As a result of the hydrogen treatment the recombination losses are reduced, the effective diffusion length is increased and the photo-current level is raised. The increase in the photo-current due to the hydrogen treatment rises constantly from a wave length of 550 nm and reaches a maximum at a wavelength of 970 nm. At the wavelength of 970 nm the effective diffusion length becomes manifest and the photo-current, and the increase therein, reduce.

For short wavelengths, e.g. 400 nm to 500 nm, the change carriers are generated in the vacinity of the n+-layer. The photo-current generation in this diffused zone is similar to that in the case of a monocrystalline silicon solar cell.

For wavelengths of 600 nm to 700 nm the charge carriers are mostly generated in the base region of the cell close to the n+-p-junction, with the result that most of the charge carriers reach the junction for current generation. The photo-current attenuation is not yet manifest at these wavelengths.

For wavelengths of 600 nm to 1000nm the charge carriers are generated in the bulk of the cell, remote from the n+-p-junction. The probability that bulk recombination effects can occur in these charge carriers increases and the attenuation of the photo-current comes more to bear.

Figure 9:
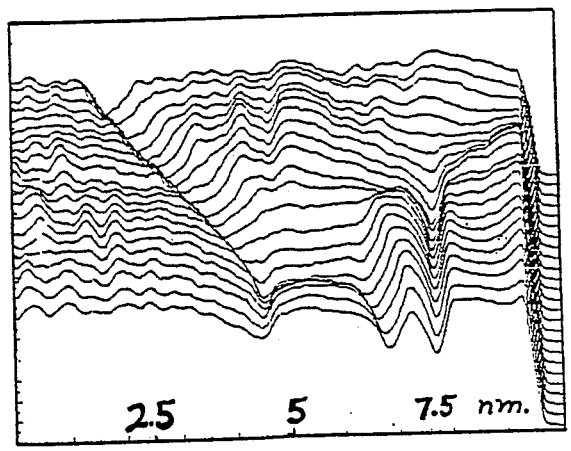
Figure 10:
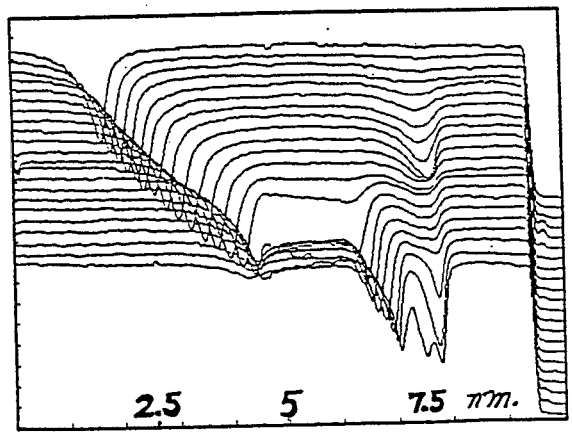

FIGS. 9 and 10 represent locally analyzed measurements of the photo-current sensitivity with a wavelength of 899 nm carried out on polycrystalline SILSO-solar cells prior to the hydrogen treatment (FIG. 9) and following the hydrogen treatment (FIG. 10). The locally analyzed measurements of the photo-current sensitivity indicate that the electrical equivalent diagram of the grain boundaries is characterized by curve troughs and that of the internal grain defects is characterized by a curve ripple.

The photo-sensitivity following hydrogen treatment represented in FIG. 10 indicates that the curve ripple has disappeared as a result of the passivation of the internal grain defects. A clear reduction in the recombination losses can be detected at some grain boundaries where the trough structure has been smoothed out. However, other grain boundaries exhibit an intensified, bell-like trough structure with an unchanged trough base. Here the grain boundary acts as charge carrier source, the generation rate of which cannot be increased by hydrogen treatment.

In order to carry out the passivation in accordance with the invention, hydrogen ions, oxygen ions, nitrogen ions or a combination thereof can act simultaneously or successively on the electrically conductive material. The superimposed d.c. voltage, treatment time and the resultant temperature of the electrically conductive material can be selected to be such that specified zones of the electrically conductive material are preferably passivated by specified ions. Oxygen ions or nitrogen ions can preferably serve to passivate the surface of the electrically conductive material. A silicon layer can also be deposited, for example, in order to passivate the surface of a semiconductor material. A silicon layer of this kind can be grown in crystalline fashion on a polycrystalline or monocrystalline surface. When a silane ($SiH_4$-) plasma is used, $SiH_x$ ions can act upon the electrically conductive material. Where the temperature of the material is appropriate and where the other process conditions are appropriate it is possible both to deposit a passivating silicon layer on the material and to diffuse hydrogen ions into the material. The silane plasma can also be combined with an oxygen plasma.

A process in accordance with the invention can be used to passivate grain boundaries and internal grain defects in polycrystalline materials, any crystal defects in monocrystalline materials, and any local disturbance centres or other recombination centres in amphorous materials. A process in accordance with the invention can also be used to passivate any type of surface of any type of material.

There has thus been shown and described a novel process for passivating crystallographic defects internally and at the surface of electrically conductive material fulfills all the objects and advantages sought therefore. Many changes, modifications, variations and other uses and applications of the subject invention will, however, become apparent to those skilled in the art after considering this specification and the accompanying drawing which disclose the preferred embodiments therefore. In addition to the modifications, variations and other uses and applications of the subject invention will, however, become apparent to those skilled in the art after considering this specification and the accompanying drawing which disclose the preferred embodiments therefore.

We claim:

1. A process for the passivation of crystalline material subject to structural defects including grain boundaries, internal grain defects, and surface defects and the crystalline material is electrically conductive material, the processing comprising the steps of: producing a high-frequency gas discharge having a prescribed volume containing atomic ions suitable for passivation; accelerating the atomic ions suitable for passivation by a superimposed d.c. voltage producing an electric field occupying a volume corresponding to the prescribed volume in the high-frequency gas discharge plasma; and directing the acceleration of atomic ions toward the electrically conductive material for combining with the electrically conductive material.

2. A process in accordance with claim 1, wherein hydrogen ions act upon the electrically conductive material.

3. A process in accordance to claim 2, wherein oxygen ions act upon the electrically conductive material.

4. A process according to claim 2, wherein nitrogen ions act upon the electrically conductive material.

5. A process according to claim 2, wherein a plasma is used to provide means for depositing silicon layer.

6. A process according to claim 2, wherein monocrystalline material is passivated.

7. A process in accordance with claim 2, wherein the surface of an electrically conductive material is passivated.

8. A process according to claim 1, wherein oxygen ions act upon the electrically conductive material.

9. A process according to claim 8, wherein nitrogen ions act upon the electrically conductive material.

10. A process according to claim 8, wherein a plasma is used to provide means for depositing silicon layer.

11. A process according to claim 8, wherein monocrystalline material is passivated.

12. A process according to claim 11, wherein polycrystalline material is passivated.

13. A process according to claim 8, wherein polycrystalline material is passivated.

14. A process in accordance with claim 8, wherein the surface of an electrically conductive material is passivated.

15. A process according to claim 1, wherein nitrogen ions act upon the electrically conductive material.

16. A process according to claim 15, wherein a plasma is used to provide means for depositing silicon layer.

17. A process according to claim 15, wherein a silane plasma is used.

18. A process according to claim 17, wherein polycrystalline material is passivated.

19. A process according to claim 17, wherein monocrystalline material is passivated.

20. A process in accordance with claim 17, wherein the surface of an electrically conductive material is passivated.

21. A process according to claim 15, wherein polycrystalline material is passivated.

22. A process according to claim 15, wherein monocrystalline material is passivated.

23. A process in accordance with claim 15, wherein the surface of an electrically conductive material is passivated.

24. A process according to claim 1, wherein a plasma is used to provide means for depositing silicon layer.

25. A process according to claim 24, wherein polycrystalline material is passivated.

26. A process according to claim 24, wherein monocrystalline material is passivated.

27. A process in accordance with claim 24, wherein the surface of an electrically conductive material is passivated.

28. A process according to claim 1, wherein polycrystalline material is passivated.

29. A process according to claim 1, wherein monocrystalline material is passivated.

30. A process in accordance with claim 1, wherein the surface of an electrically conductive material is passivated.

31. A process as claimed in one of the claims 1, 2, 8, 15, 24, 17, 28, 29 or 30, wherein that the electrically conductive material is arranged on a d.c. voltage electrode which delimits the plasma.

32. A process as claimed in one of the claims 1, 2, 8, 15, 24, 17, 28, 29 or 30, wherein that the ion energy levels are set by means of the connected d.c. voltage to be such that it is possible to dispense with additional substrate heating.

* * * * *